(12) United States Patent
Hier et al.

(10) Patent No.: US 6,407,439 B1
(45) Date of Patent: Jun. 18, 2002

(54) PROGRAMMABLE MULTI-WAVELENGTH DETECTOR ARRAY

(75) Inventors: Harry S. Hier, Sykesville; Olaleye A Aina, Columbia, both of MD (US)

(73) Assignee: Epitaxial Technologies, LLC, Baltimore, MD (US)

( * ) Notice: Subject to any disclaimer, the term of this patent is extended or adjusted under 35 U.S.C. 154(b) by 0 days.

(21) Appl. No.: 09/378,212

(22) Filed: Aug. 19, 1999

(51) Int. Cl.$^7$ .............................................. H01L 31/00
(52) U.S. Cl. ...................................... 257/440; 257/431
(58) Field of Search ........................ 257/21, 440, 443

(56) References Cited

U.S. PATENT DOCUMENTS

| | | | | |
|---|---|---|---|---|
| 4,613,417 A | * | 9/1986 | Laskowski et al. | 257/79 |
| 5,227,648 A | * | 7/1993 | Woo | 257/185 |
| 5,552,603 A | * | 9/1996 | Stokes | 250/338.4 |
| 5,646,421 A | * | 7/1997 | Liu | 257/21 |
| 5,661,074 A | * | 8/1997 | Tischler | 438/32 |
| 5,671,914 A | * | 9/1997 | Kalkhoran et al. | 257/77 |
| 6,156,581 A | * | 12/2000 | Vaudo et al. | 438/22 |

FOREIGN PATENT DOCUMENTS

EP    0 448 869 A1    * 10/1991

* cited by examiner

*Primary Examiner*—Allan R. Wilson
(74) *Attorney, Agent, or Firm*—H. C. Lin Patent Agent (57) ABSTRACT

More than one photodetectors, each sensitive to different wavelengths, are integrated on a common semiconductor substrate. The different photodetectors can be stacked over one another or placed laterally on the common substrate. Gratings may be placed over each photodetector to sharpen the spectral response. Three such photodetectors can form a pixel of an active matrix array for an image sensor. The different photodetectors in each pixel can be multiplexed electronically. The electronic circuits for activating the different photodetectors can be integrated on the same substrate.

24 Claims, 8 Drawing Sheets

Infrared Astronomy → Zodiacal Scattered Light

Missile Seeker and Night Vision →

A) Near IR; 1.3-1.5 μm
B) Mid-Wave: 3-5 μm
C) Long-Wave: 8-10 μm
D) Very-Long Wave: >12 μm

| B 4.6 | C 12 | C 8.0 | C |
|---|---|---|---|
| B 4.0 | C 10 | B 3.0 | 0.5 |
| A | A | A | A |

InP- Substrate (reflective)

Pixels

PROGRAMMABLE MULTI-WAVELENGTH DETECTOR ARRAY

BACKGROUND OF THE INVENTION

1. Field of the Invention

This invention relates to photodetectors—in particular to an integrated multiple-wavelength detector array, which is programmable.

2. Description of the Related Art

Figure 1:
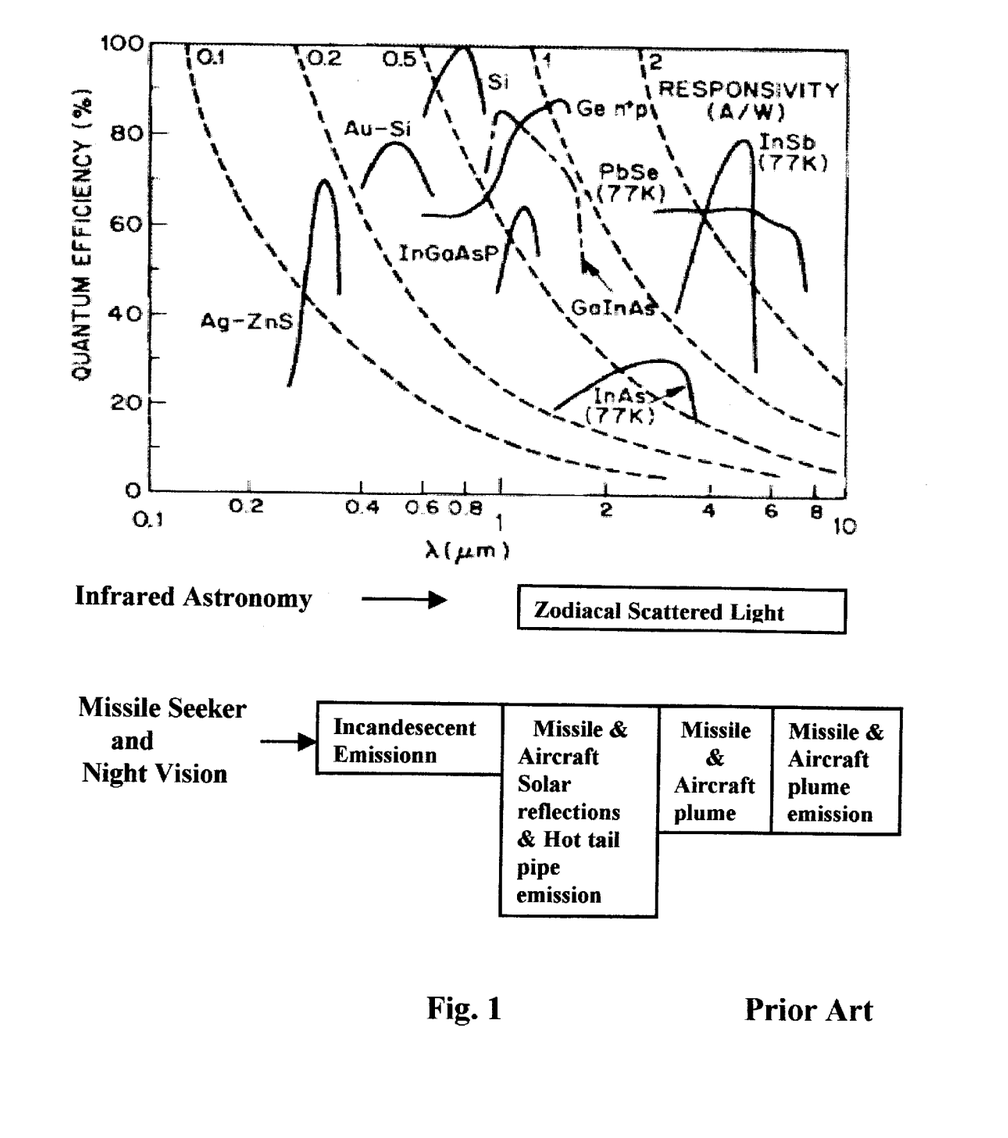
FIG. 1 shows the spectra range for typical photodetector materials and applications.

The applications for high performance infrared (IR) photodetectors are wide ranging. These include missile seekers, infrared astronomy, infrared cameras for surveillance and industrial process monitoring, ellipsometry and environmental monitoring. Many such photonic and sensor applications require a wide wavelength range. However, photodetectors have a limited wavelength of operation. FIG. 1 shows the wavelength spectra of different types of existing photodetectors and spectral requirements of different types of applications. The wavelength limitation of photodetectors is due to the fact that photodetection in semiconductors is strongly dependent on the energy band of the semiconductor material. Therefore, in order to achieve multi-wavelength operation of sensors, it is necessary to have different types of semiconductor material on the same substrate. Furthermore, in order to maximize the utility of such detectors, it is desirable to be able to electronically control the window of operation of the detector array and achieve a type of electronically controlled optical fiber. It is clear from FIG. 1 that successful development of a multi-wavelength detector will require the choice of an optimum combination of suitable materials and a technique of growing suitable epitaxial wafers having multiple material structures for the desired wavelength spectra.

Although high performance single wavelength detectors have been developed and produced, a viable approach to combining them on the same substrate for multi-wavelength operation has not been developed. The materials typically used for photodetectors such as CdS, Si and GaAs at the shorter wavelengths and HgCdTe (MCT), GaInAs, Ge, InAs and InSb for long wavelengths cannot be easily combined on the same substrates and meet the requirements outlined above. Thus while short wavelength materials like GaAs and Si can be produced with large substrate areas, they cannot easily be integrated with MCT, InSb and other long wavelength material. In addition, the most commonly used infrared detector materials like MCT, InAs and InSb are not necessarily the most optimum to use on account of poor uniformity, poor mechanical and chemical properties and sensitivity to heat during device fabrication, a well as the unavailability of large substrates. Furthermore, the resistivity of such substrates is low, making it difficult to integrate electronic functions with the detector.

Recent advances in detector technology has resulted in the development of quantum infrared photodetectors (QWIP) based on intersubband transitions in AlGaAs/GaAs, AlInAss/GaInAs, InP/GaInAs and GaInAsP/GaInAs superlattices. These new classes of detectors have been demonstrated with performance comparable to traditional infrared detector materials like MCT. Unlike the latter, they can be fabricated on large area substrate with high yields and improved uniformity. The dominant QWIP approach is based on the AlGaAs/GaAs heterostructure, the operation of which is limited to mid- to far infrared wavelengths (i.e. >5 $\mu$)because the bandgap discontinuity of the optimum AlGaAs/GaAs heterojunction is low. The AlInAs/GaInAs heterojunction has large bandgap discontinuity suitable for shorter wavelength QWIP operation, however it is not optimum for longer wavelength operation. It is not desirable to combine these two types of heterojunction on the same substrate because of the large lattice mismatch between the two material systems.

Non-programmable two color detectors operating in mid-wave (MW)—long wave (LW) or long-wave (LW)—long wave (LW) ranges have been proposed and demonstrated. However, the integration of programmable three color detectors so far has not been proposed.

BRIEF SUMMARY OF THE INVENTION

An object of this invention is to integrate photodetectors for different wavelengths in a monolithic structure. Another object of this invention is to integrate photodetectors of different wavelengths as an active matrix array. Still another object of this invention is to integrate programmable electronics to address each detector in a tri-color photodetector array. A further object of this invention is to provide an integrated tri-color photodetector which is durable and reliable.

These objects are achieved by the choice of an optimum combination of suitable materials and a technique for growing suitable epitaxial wafers having material structure for the desired wavelength spectra. Photodetectors for different wavelengths are integrated on a common substrate. These detectors are multiplexed for sensing the different wavelengths. Peripheral electronics for multiplexing can also be integrated on the same substrate.

Three photodetectors of different wavelengths can form a pixel of an active matrix array with hundreds of rows and columns.

BRIEF DESCRIPTION OF THE SEVERAL VIEWS OF THE INVENTION

DETAILED DESCRIPTION OF THE INVENTION

Figure 2:
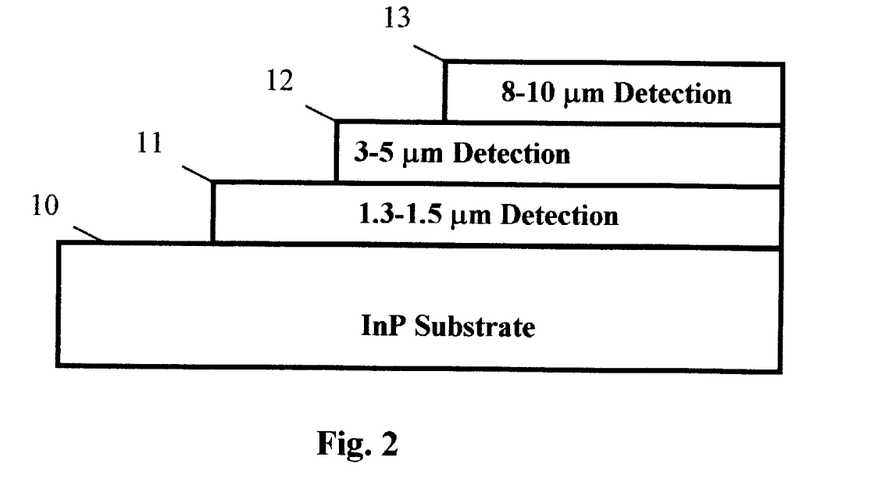
FIG. 2 shows a vertically integrated multi-wavelength detector based on this invention.

FIG. 2 shows a wavelength scheme for a particular set of material for multiwavelength detectors. As an example, three photodetectors, 11, 12 and 13 are stacked over a InP substrate 10. The first layer detects light wave with a wavelength in the 1.3 to 1.5 $\mu$ range but is transparent to longer wavelength light wave. The second detector 12 detects light wave with a wavelength in the 3–5 $\mu$m range and is transparent to light outside this particular range. The third detector 13 detects light wave with a wavelength in the 8–10μm LW range but is transparent to shorter wavelengths.

The detector material can be GaAs/AlGaAs, GaInAs/AlGaAs, GaAs/AlGaP, GaInAs/AlInAs (InP), GaInAs/AlInGaAs, GaInAs/GaInAsP, GaInAs/AlGaAsSb, GaInAs/AlPSb, GaAsSb/AlInAs (or InP), GaAsSb/AlGaAsSb, InAs/AlGaAsSb, InAs/AlInAsSb, etc. of compound semiconductor operating in 0.65 μm to 17.0 μm wavelength. The substrate can be GaAs or InP. Bonded InP/GaAs or based heterostructures to Si (other) can be used as substrate. Si, Ge and C based heterostructuree on Si or Ge can also be useddetector material. The wavelength can be selected by selecting Al composition in AlGaInAs/GaInAs or AlGaAsSb/GaAsSb which is lattice matched to a InP substrate. Peripheral electronics for the photodetectors (not shown) can also be fabricated on the substrate.

Examples of materials structures for the programmable multi-wavelength detectors are:

QWIP for MW (3–5 μm) and LW (8–10 μm) detection:— The QWIP material structure uses GaInAs as well and AlInAs and AlGaInAs barriers for the 3–5 μm and 8–10 μm wavelengths respectively. The barrier can be undoped or delta-doped to provide 2-dimension electron gas (2DEG) in the well to improve the performances. By varying the Al composition, which is lattice-matched to InP, various bad gap discontinuities and hence wavelengths can be selected. The well can be uniformly doped, 2DEP, self assembled quantum dots, or InAs sub-well. The QWIP structure consists of 20–50 layers of GaInAs well and AlInAs or AlGaInAs barrier with doped contacts on either sides.

Band-to-band detection for 0.65–2.0 μm:—The detectors operating in wavelength range for 1.3–1.5 μm can be photoconductive or photovoltaic mode. The undoped GaInAs layer can be used for contoconductive mode of operation. However for photoconductive and MSM detector different layered design should be used. For example, the layer structure for MSM detector is AlInAs buffer layer, GaInAs absorbing layer, AlGaInAs grading layer, and AlInAs or AlGaAsSb Schottky layer. Similar structure for PIN or quantum-well photo diode can be designed.

For the QWIP, the well can serve to hold 2-dimensional electron gas (2DEG) for a high frequency field effect transistor or as a sub-well of InAs to improve sensitivity and leakage.

Figure 3:
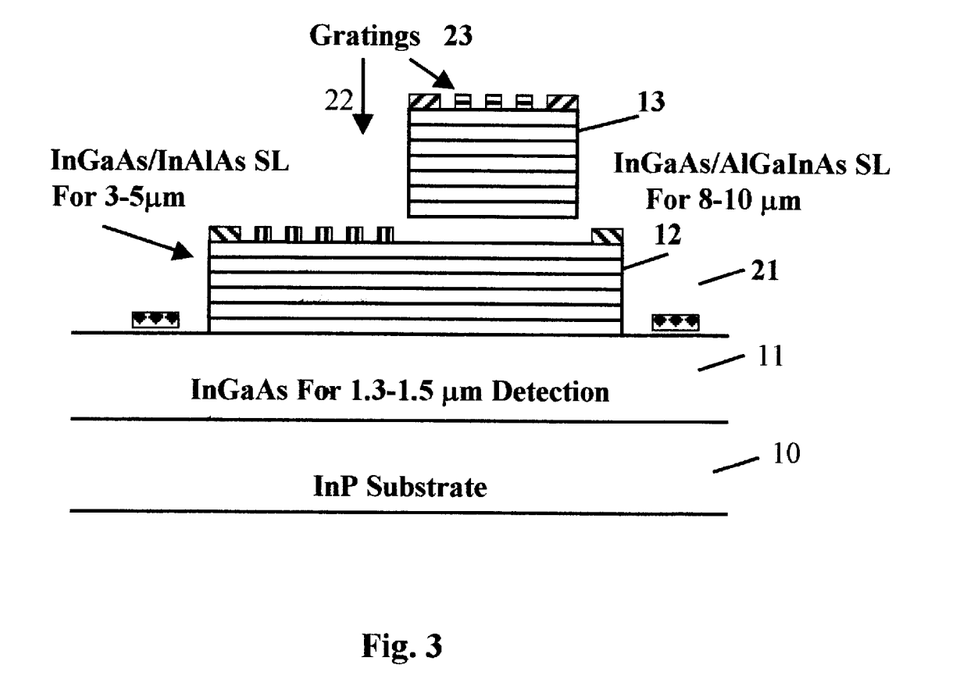
FIG. 3 shows a material structure and device cross-section for a three-color photodetector.

FIG. 3 shows the use of grating over the structure shown in FIG. 2 as filters to increase the selectivity of these photodetectors. Gratings 22 for the 8to 10 μm wavelength photodetector 12 have a longer pitch than gratings 23 for the shorter 3to 5 μm wavelength detector 13.

Figure 4:
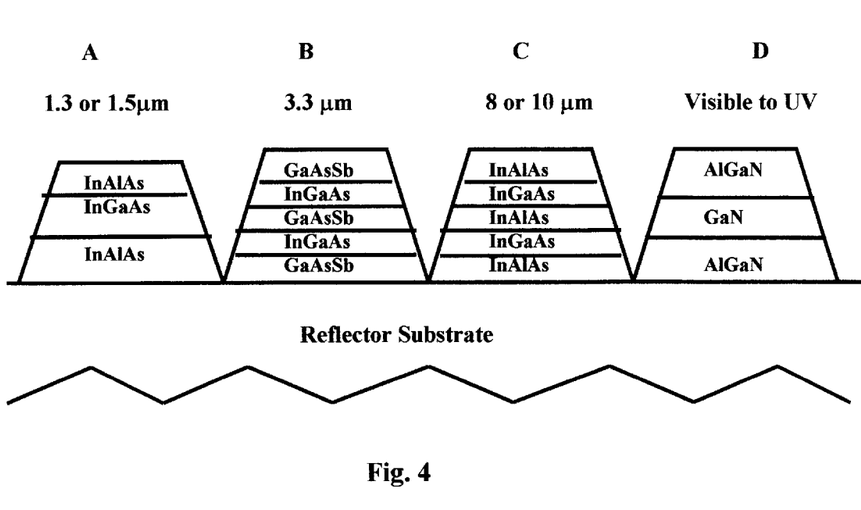
FIG. 4 shows a laterally integrated multi-wavelength detector of this invention.

FIG. 4 shows a selective epitaxy grown lateral multi-wavelength detector structure. The substrate 30 can be a light reflector. Four mesas are fabricated over the substrate 30. At mesa "a" at the left side is a photodetector 31 for 1.3 or 1.5 μm wavelength light with three successive layers of InAlAs or AlInAs, InGaAs or GaInAs, and InAlAs. The second mesa "b" is a photodetector 32 for 3.3 μm wavelength using successive layers of GaAsSb, InGaAs or AlInAs, GaAsSb or GaInAs, and GaAsSb. The third mesa "c" is photodetector 33 for 8 or 10 μm wavelength using successive layers of InAlAs or AlInAs, InGaAs or GaInAs, InAlAs or AlInAs, InGaAs or GaInAs, and InAlAs or AlInAs. The fourth mesa "d" is a photodetector 34 for visible to ultra-violet light using successive layers of AlGaN, GaN, AlGaN.

Figure 5:
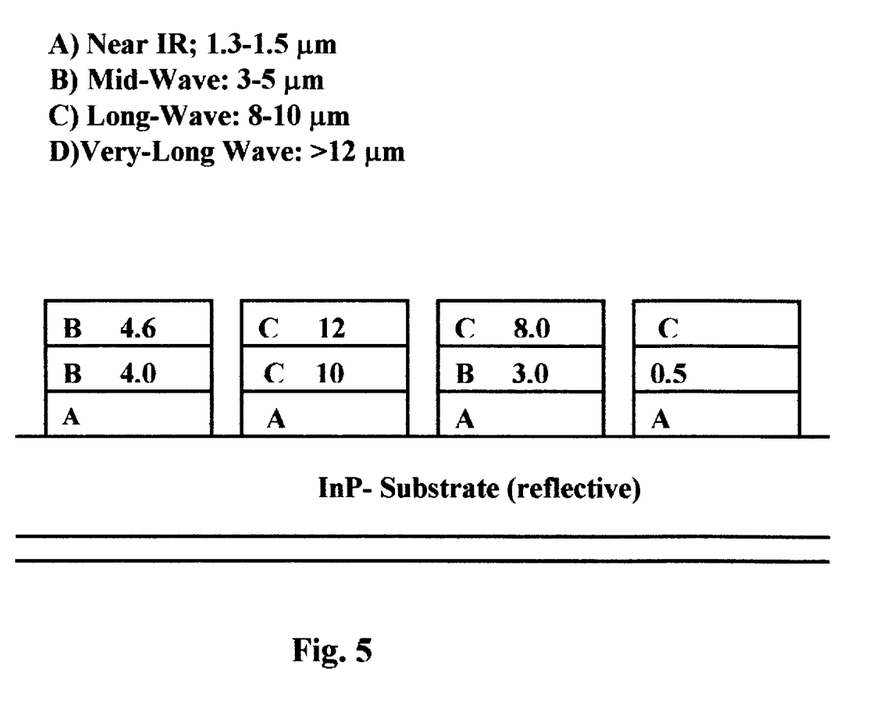
FIG. 5 shows a wavelength scheme for a particular set of material structure for multi-wavelength detector.

The mesas in the lateral multi-wavelength detector structure shown in FIG. 4 can be stacked vertically as shown in FIG. 5 to form a vertical multi-wavelength detector similar to the structure shown in FIG. 2. The detector wavelength combinations of stacking "c" layers over "a" layers are shown at the left side. The detector wavelength combinations of stacking "b" layers over "a" layers are shown at the right side.

The layers for the multi-wavelength photodetectors can be fabricated as follows: The QWIP for the photoconductive (voltaic) detectors can be gown on solid source gas) source, molecular beam epitaxy (MBE), organo-metal vapor phase epitaxy (OMVPE) or vapor phase epitaxy (VPE), gas source MBE, or Chemical Beam epitaxy (CBE). Electronics on III–V compound semiconductor is grown on the same system. If the electronics is grown on Si, selective epitaxy (or bonding followed by epitaxial growth) for the growth of the detector material. The detector materials (multi-wavelength) with etch stop (InP, etc.) are grown with both vertical and selective epitaxy techniques. The devices are fabricated using standard processing techniques of III–V compound semiconductor devices and circuits.

Figure 6:
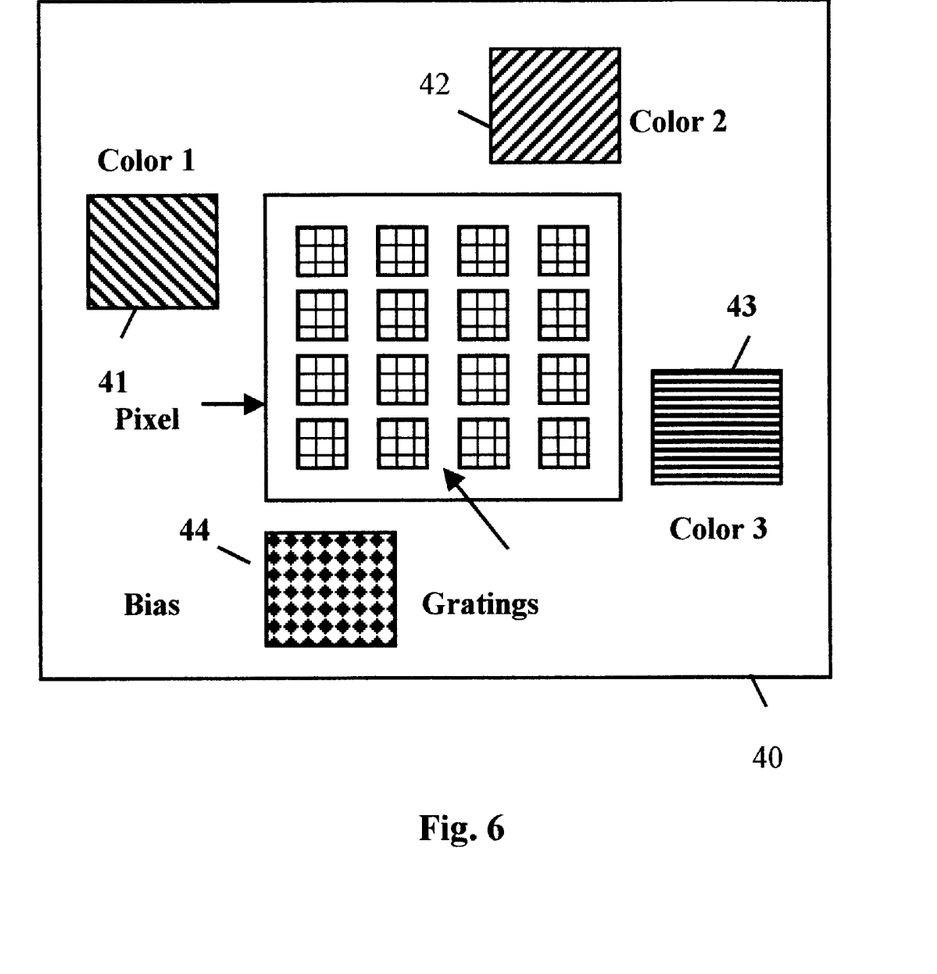
FIG. 6 shows tri-color pixel for an active matrix array image sensor.
Figure 7:
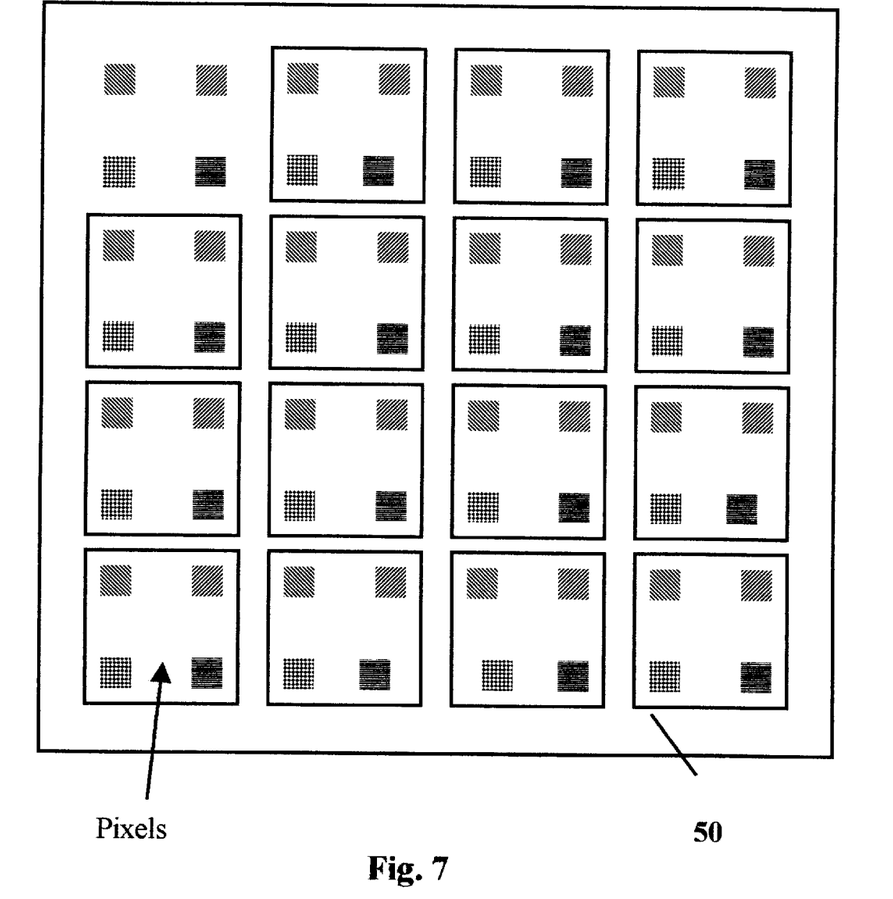
FIG. 7 shows the layout of a multi-wavelength photo array.

The multi-wavelength photodetectors can be integrated as a pixel of an active matrix array. Each pixel has a number of multi-wavelength photodetectors, (16 for example in FIG. 6) fabricated on a common substrate 40. Also shown in FIG. 6 are four connection pads 41, 42, 43 and 44. Three of these pads are connected to the tri-color photodetectors and are multiplexed electronically for detecting different range of wavelengths. The fourth pad is for dc biasing. A large number of these pixels are arranged in a matrix array 50 as shown in FIG. 7. Such an array forms an image sensor. The multiplexing can be programmed to sequence the photodetection for different colors.

Figure 8A:
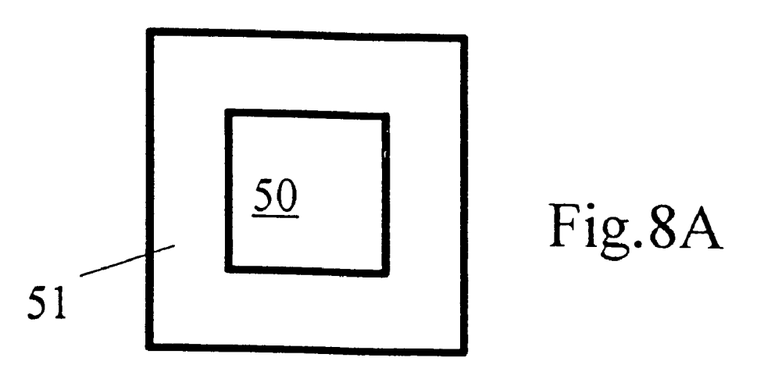
FIG. 8A shows the top view of an integrated multi-wavelength photodetector array with peripheral integrated circuits.
Figure 8B:
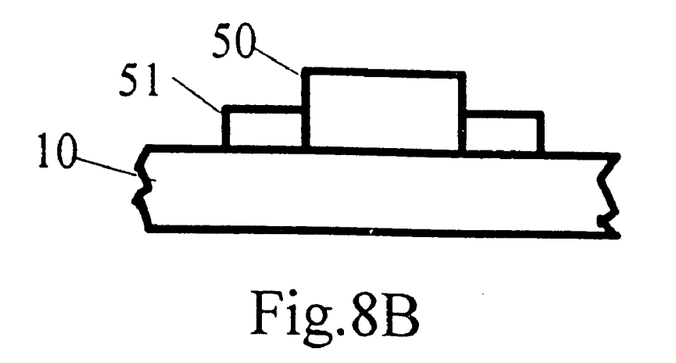
FIG. 8B shows the side view of FIG. 8A.

The peripheral circuits for the multi-wavelength photodetectors can be integrated with the active matrix array 50 as shown in FIG. 8A. In this figure, the peripheral circuit 51 surrounds the active matrix array 50 and is fabricated on a common substrate 10 as the photodetectors. FIG. 8B shows the side view of FIG. 8B.

While the preferred embodiments of the invention have been shown and described it will be apparent to those skilled in the art that various modifications may be made in the embodiments without departing from the spirit of the present invention. Such modifications are all within the scope of this invention.

What is claimed is:

1. An integrated multi-wavelength photodetecting device, comprising:
   a semi-insulating compound semiconductor substrate, and
   more than one stack of photodetectors each sensitive to multi-ranges of optical wavelengths different from one another, laid laterally over and integrated on said semi-insulating compoud semiconductor substrate.

2. An integrated multi-wavelength photodetecting device as described in claim 1, wherein said substrate is selected from the group consisting of: InP, GaAs.

3. An integrated multi-wavelength photodetecting device as described in claim 1, wherein said photodetectors are selected from the group consisting of GaAs/AlGaAs, GaInAs/InP(AlInAs), GaInAs/AlGaAs, GaAsSb/AlGaAsSb, GaAsSb/AlInAs (InP) and GaAs/GaInP.

4. An integrated multi-wavelength photodetecting device as described in claim 3, wherein the aluminum composition in said group can be adjusted to select a particular wavelength.

5. An integrated multi-wavelength photodetecting device as described in claim 1, wherein at least one of said photodetectors is a quantum well infrared photodetector, QWIP.

6. An integrated multi-wavelength photodetecting device as described in claim 1, wherein at least one of said photodetectors is a band-to-band photodetector.

7. An integrated multi-wavelength photodetecting device as described in claim 1, further comprising a grating over at least one of said photodetectors.

8. An integrated multi-wavelength photodetecting device as described in claim 1, wherein there are two photodetectors.

9. An integrated multi-wavelength photodetecting device as described in claim 1, wherein there are three photodetectors.

10. An integrated multi-wavelength photodetecting device as described in claim 1, wherein one of said photodetectors has successive layers of AlInAs, GaInAs and AlGaInAs grown over said substrate and sensitive to wavelength of 1.3 $\mu$m to 1.5 $\mu$m.

11. An integrated multi-wavelength photodetecting device as described in claim 1, wherein one of said photodetectors has successive layers of GaAsSb, GaInAs, GaAsSb, and InGaAs grown over said substrate and sensitive to wavelength of 3.3 $\mu$m.

12. An integrated multi-wavelength photodetecting device, comprising:

a semiconductor substrate;

more than one photodetectors each sensitive to a range of optical wavelength different from one another, and integrated on said semiconductor substrate, wherein one of said photodetectors has successive layers of AlInAs, GaInAs, AlGaInAs, InAlAs and GaInAs grown over said substrate and sensitive to wavelength of 8 $\mu$m to 10$\mu$m.

13. An integrated multi-wavelength photodetecting device as described in claim 1, wherein one of said photodetectors has successive layers of AlGaN, GaN and AlGaN grown over said substrate and sensitive to wavelength in the visible to ultra-violet light range.

14. An integrated multi-wavelength photodetecting device as described in claim 1, wherein said device is an active matrix array comprising an array of pixels each comprising more than one photodetector.

15. An integrated multi-wavelength photodetecting device as described in claim 14, wherein the photodetectors in each one of said pixels are activated by multiplexing.

16. An integrated multi-wavelength photodetecting device as described in claim 15, wherein electronic circuits for said multiplexing are integrated on said substrate.

17. An integrated multi-wavelength photodetector device as described in claim 2, wherein said substrate is created from the group consisting of bonding and fusion.

18. An integrated multi-wavelength photodetector device as described in claim 2, wherein said InP based detector are created by growing metamorphic buffer on GaAs.

19. An integrated multi-wavelength photodetector device as described in claim 5, wherein at least one of said QWIP based detector is of n-type.

20. An integrated multi-wavelength photodetector device as described in claim 5, wherein at least one of said QWIP based detector is of p-type.

21. An integrated multi-wavelength photodetector device as described in claim 5, wherein at least one of said QWIP is at normal incidence.

22. An integrated multi-wavelength photodetector device as described in claim 5, wherein said QWIP based detector material is selected from the group consisting of GaInAs/AlAsSb, GaInAs/AlInGaAs, GaInAs/AlGaAsSb, GaInAs/GaInAsP, GaInAs/AlGaInAsSb, GaAsSb/AlAsSb, and GaAsSb/AlGaInAsSb.

23. An integrated multi-wavelength photodetector device as described in claim 5, wherein the well has a 2-DEG, uniformly doped, self assembled quantum dot InAs sub-well.

24. An integrated multi-wavelength photodetector device as described in claim 1, wherein the detectors are grown via a process selected from the group consisting of MBE, CBE, MEE, VPE and OMVPE.

* * * * *